(12) United States Patent
Murashima

(10) Patent No.: US 10,876,837 B2
(45) Date of Patent: Dec. 29, 2020

(54) CIRCUIT DEVICE, AND PHYSICAL QUANTITY MEASURING DEVICE, OSCILLATOR, ELECTRONIC DEVICE, AND VEHICLE USING THE CIRCUIT DEVICE

(71) Applicant: Seiko Epson Corporation, Tokyo (JP)

(72) Inventor: Noriyuki Murashima, Chino (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/367,377

(22) Filed: Mar. 28, 2019

(65) Prior Publication Data
US 2019/0301864 A1    Oct. 3, 2019

(30) Foreign Application Priority Data

Mar. 29, 2018   (JP) .................. 2018-066060

(51) Int. Cl.
G01C 19/5607    (2012.01)
H03L 1/02       (2006.01)

(52) U.S. Cl.
CPC .......... *G01C 19/5607* (2013.01); *H03L 1/022* (2013.01)

(58) Field of Classification Search
CPC ............ G01C 19/5607; G01C 19/5614; G01C 19/5776; G01C 19/56; H03L 1/022
See application file for complete search history.

(56) References Cited

U.S. PATENT DOCUMENTS

| | | | |
|---|---|---|---|
| 6,163,651 A * | 12/2000 | Washisu | G02B 27/646 348/E5.046 |
| 2003/0001680 A1* | 1/2003 | Knecht | H03L 1/025 331/18 |
| 2003/0015729 A1* | 1/2003 | Bosco | H01L 21/8258 257/190 |
| 2003/0020107 A1* | 1/2003 | Bosco | H01L 21/31691 257/296 |
| 2005/0046497 A1* | 3/2005 | Nakanishi | H03K 3/0322 331/57 |
| 2006/0123908 A1* | 6/2006 | Ito | G01C 19/56 73/514.32 |
| 2007/0001287 A1* | 1/2007 | Bosco | H01L 23/10 257/704 |
| 2008/0111525 A1* | 5/2008 | Fukuzawa | H04B 1/1607 323/273 |
| 2008/0111585 A1* | 5/2008 | Fukuzawa | G01C 19/5607 327/41 |
| 2008/0197945 A1* | 8/2008 | Franson | H01Q 13/08 333/238 |
| 2019/0033431 A1* | 1/2019 | Haneda | G01S 17/931 |

FOREIGN PATENT DOCUMENTS

| | | |
|---|---|---|
| JP | 2007-081530 A | 3/2007 |
| JP | 2008-216187 A | 9/2008 |
| JP | 2008-261844 A | 10/2008 |

\* cited by examiner

*Primary Examiner* — Helen C Kwok
(74) *Attorney, Agent, or Firm* — Harness, Dickey & Pierce, P.L.C.

(57) ABSTRACT

A circuit device includes a filter circuit to which a detection signal is input and which has a resistance element including a metal thin film layer, and an A/D conversion circuit performs A/D conversion of the detection signal filtered by the filter circuit and outputs detection data.

19 Claims, 10 Drawing Sheets

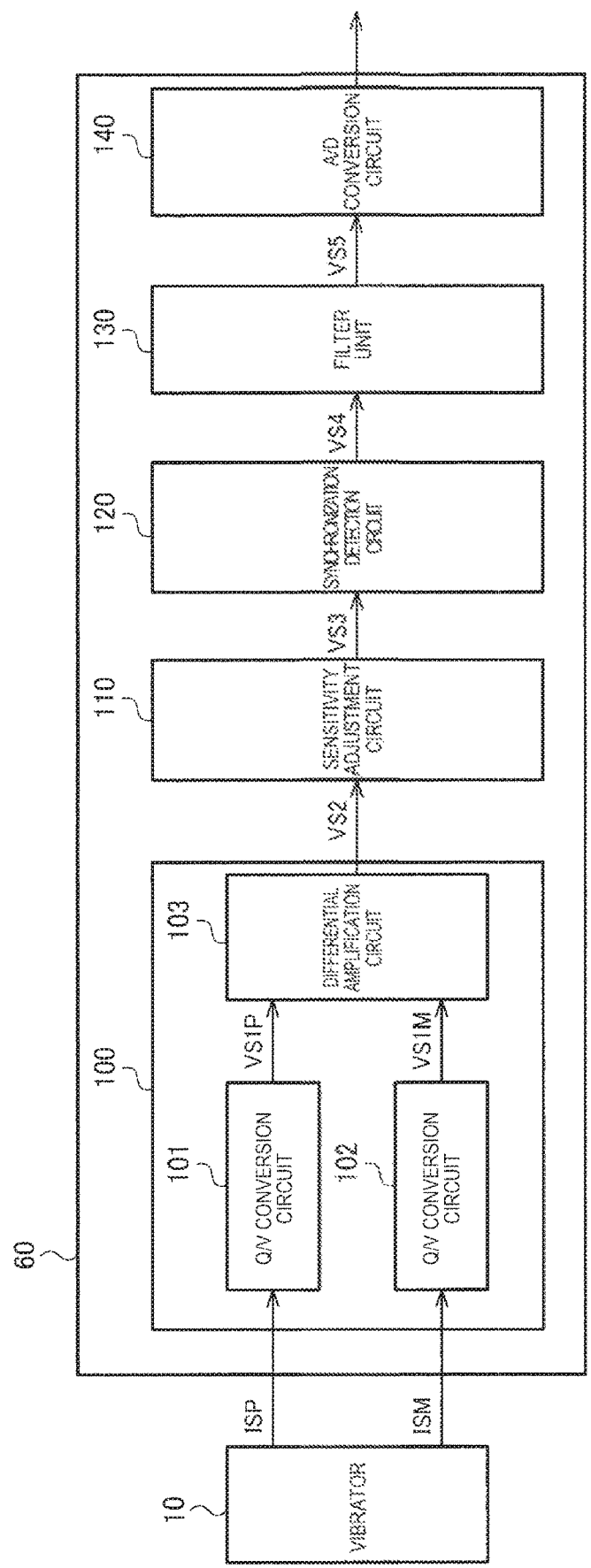

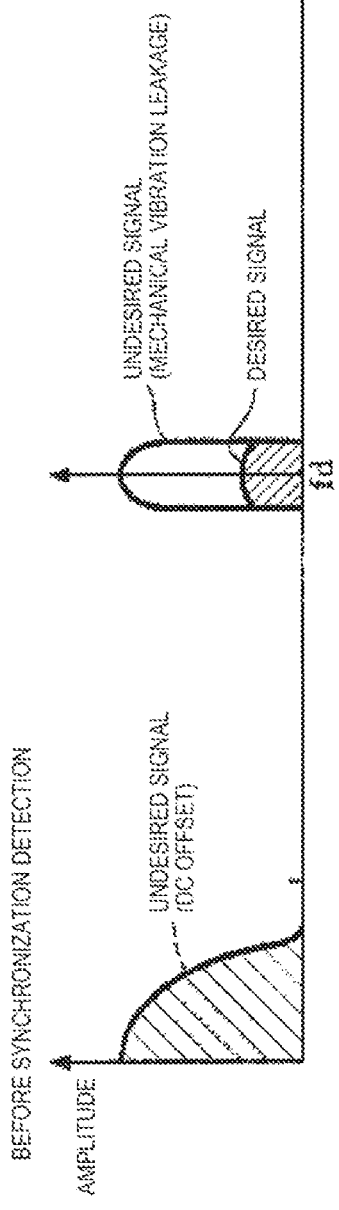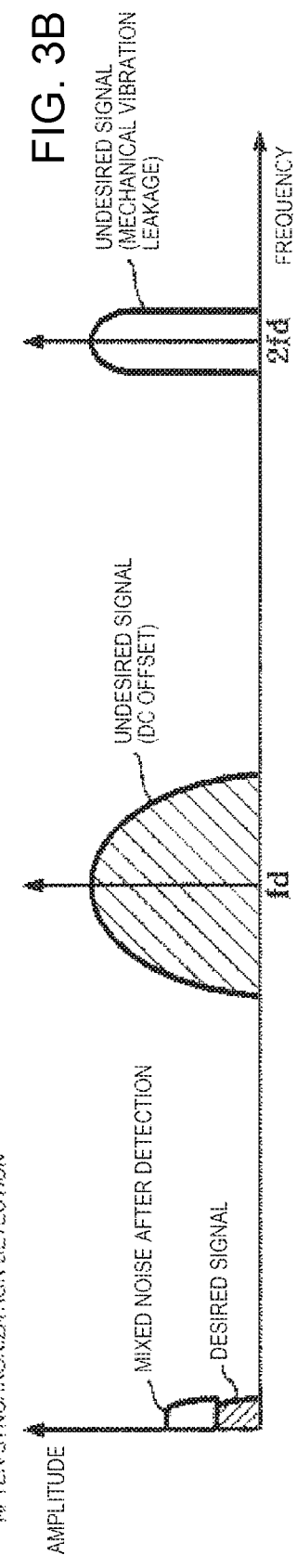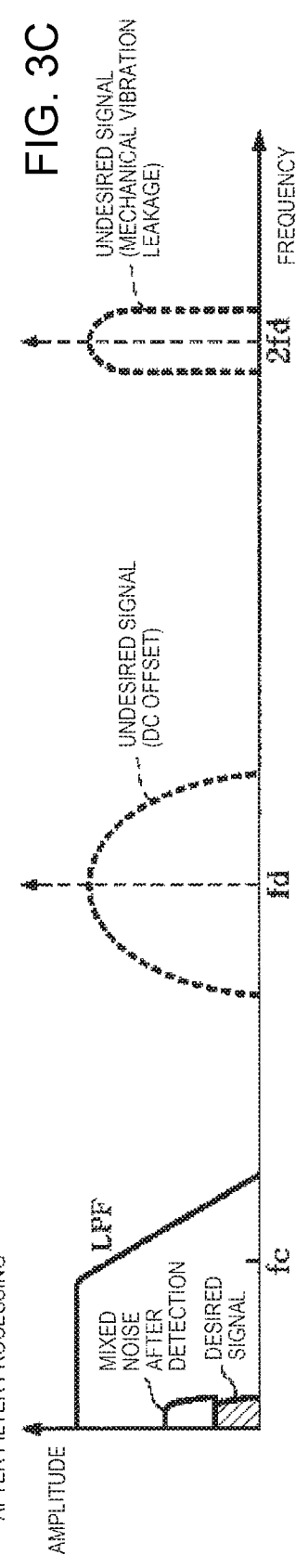

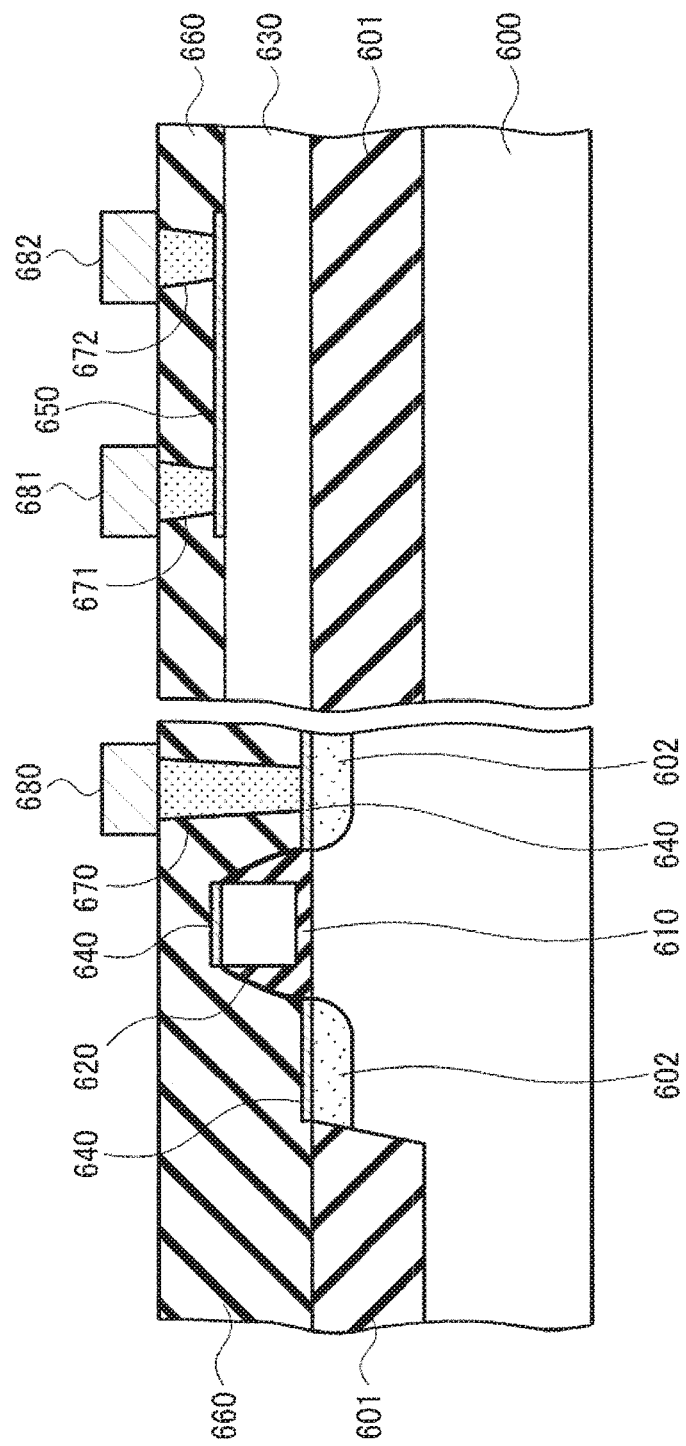

CIRCUIT DEVICE, AND PHYSICAL QUANTITY MEASURING DEVICE, OSCILLATOR, ELECTRONIC DEVICE, AND VEHICLE USING THE CIRCUIT DEVICE

CROSS-REFERENCE

The entire disclosure of Japanese Patent Application No. 2018-066060, filed Mar. 29, 2018 is expressly incorporated by reference herein.

BACKGROUND

1. Technical Field

The present invention relates to a circuit device, and a physical quantity measuring device, an oscillator, an electronic device, a vehicle, and the like using the circuit device.

2. Related Art

JP-A-2007-81530 discloses a detection circuit for detecting a signal from a physical quantity transducer such as a gyro sensor, and the like, which includes an amplification circuit, a synchronization detection circuit, a filter, and an A/D conversion circuit. The filter serves as a pre-filter of the A/D conversion circuit.

It is also known that a detection signal from a temperature sensor is fed through the filter and the A/D conversion circuit for the temperature compensation of the oscillation frequency at the oscillator.

The gyro sensor disclosed in JP-A-2007-81530 uses a polysilicon resistor in the amplification circuit at a rear end of the synchronization detection circuit that synchronously detects a sensor signal. For this reason, the 1/f noise is increased, and in the perspective of long-term stability (by Allan variance evaluation), this 1/f noise may not be reduced by the Allan variance for long time intervals, which incurs a long-term stability problem.

SUMMARY

An advantage of some aspects of the invention is to provide a circuit device capable of reducing the occurrence of temporal fluctuation over a long period of time in a digital signal, and a physical quantity measuring device, an oscillator, an electronic device, and a vehicle using the circuit device.

(1) An aspect of the invention relates to a circuit device including an input terminal to which a detection target signal from a physical quantity transducer is input, a filter circuit to which a detection signal based on the detection target signal is input and which has a resistance element including a metal thin film layer, and an A/D conversion circuit performs A/D conversion of the detection signal filtered by the filter circuit, and outputs detection data.

(2) In aspect (1) of the invention, the metal thin film layer may be formed on a non-doped polysilicon provided on a semiconductor substrate with an insulating film interposed therebetween.

(3) In aspect (2) of the invention, the circuit device may further include a first contact for connecting a first wiring and one end of the metal thin film layer; and a second contact for connecting other end of the metal thin film layer and a second wiring.

(4) In any one of aspects (1) to (3) of the invention, the metal thin film layer may be a silicide layer which is a compound of metal and silicon.

(5) In any one of aspects (1) to (4) of the invention, the filter circuit may be a low pass filter circuit including the resistance element and a capacitor.

(6) In any one of aspects (1) to (4) of the invention, the filter circuit may be a passive filter circuit including the resistance element and a capacitor.

(7) In aspect (6) of the invention, the circuit device may include a synchronization detection circuit outputs the detection signal after synchronization detection to the filter circuit.

(8) In aspect (7) of the invention, the circuit device may include an amplification circuit outputs an amplified detection signal to the synchronization detection circuit.

(9) In any one of aspects (1) to (8) of the invention, the detection signal may include a detection target signal from the physical quantity transducer and a mechanical vibration leakage signal.

(10) In aspect (9) of the invention, the circuit device may include a driving circuit that drives the physical quantity transducer.

(11) Another aspect of the invention relates to a physical quantity measuring device including a physical quantity transducer, and the circuit device according to any one of aspects (1) to (6) described above, to which a detection signal from the physical quantity transducer is input.

(12) Still another aspect of the invention relates to an oscillator including a vibrator, a filter circuit that has a resistance element to which a temperature detection signal from a temperature sensor is input and which includes a metal thin film layer, and an A/D conversion circuit performs A/D conversion of the temperature detection signal filtered by the filter circuit and outputs detection data, in which the oscillator compensates a temperature characteristic of an oscillation frequency of the vibrator based on the temperature detection signal.

(13) Still another aspect of the invention relates to an electronic device including the circuit device according to any one of aspects (1) to (10), and a processing circuit that performs processing based on detection data from the circuit device.

(14) Still another aspect of the invention relates to a vehicle including a body and a control device which is mounted on the body and includes the circuit device according to any one of aspects (1) to (10).

BRIEF DESCRIPTION OF THE DRAWINGS

The invention will be described with reference to the accompanying drawings, wherein like numbers reference like elements.

FIG. 2 is a block diagram of the detection circuit in FIG. 1 including circuit device according to an embodiment of the invention.

FIGS. 3A to 3C are diagrams showing an example of a signal waveform for explaining an operation of a detection circuit.

FIG. 4 is a cross-sectional view showing a structure of a resistance element included in the filter unit shown in FIG. 2.

DESCRIPTION OF EXEMPLARY EMBODIMENTS

Hereinafter, preferred embodiments of the invention will be described in detail. It should be noted that the embodiments described below do not unduly limit the scope of the invention described in the appended claims, and all of the configurations described in the embodiments are not necessarily essential as means for solving the invention.

Figure 1:
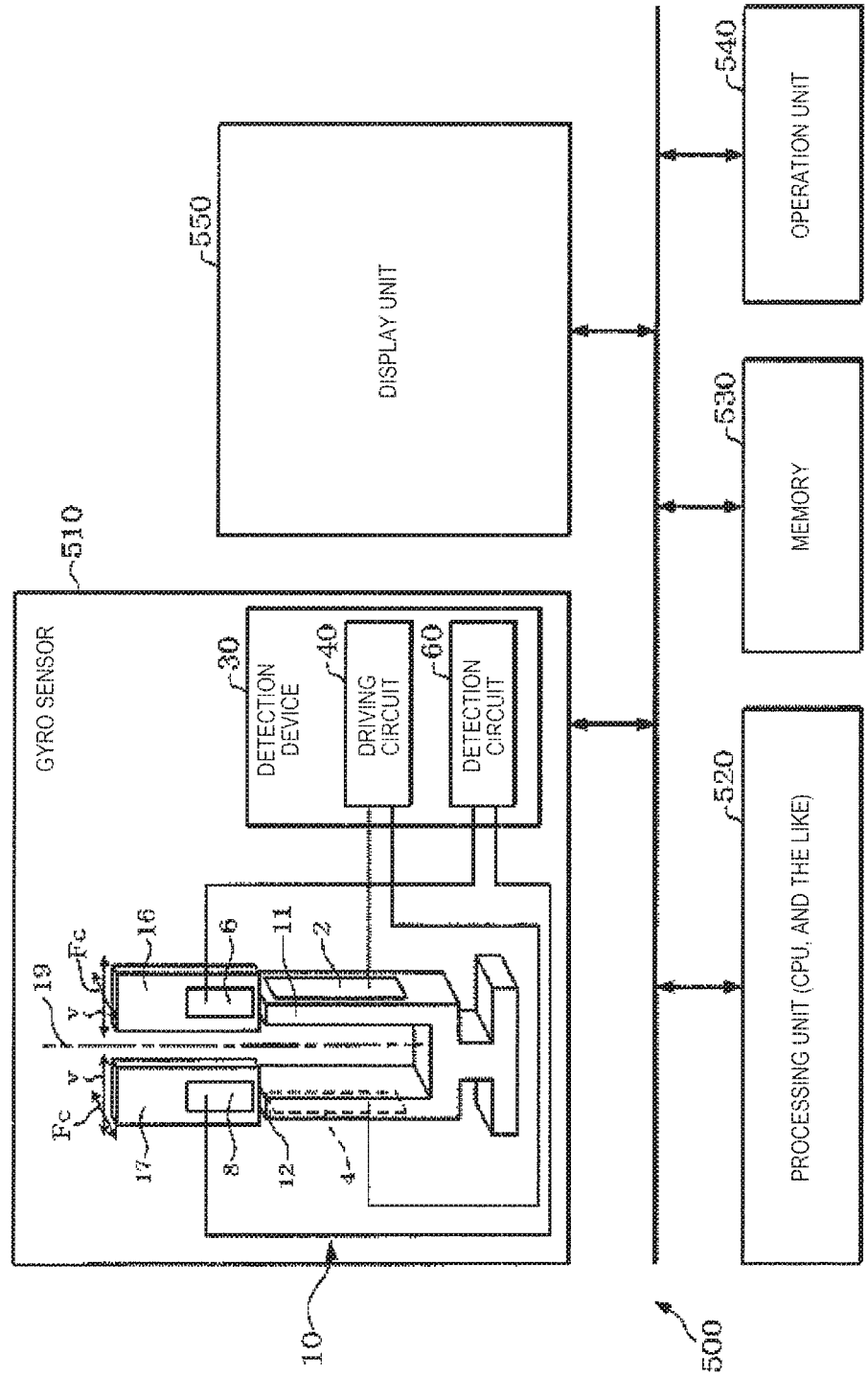
FIG. 1 is a block diagram of a physical quantity measuring device according to a first embodiment of the invention.

1. First Embodiment 1.1. Physical Quantity Measuring Device and Electronic Device FIG. 1 shows a configuration example of a gyro sensor 510 including a circuit device (detection device) 30 according to this embodiment and an electronic device 500 including the gyro sensor 510. It should be noted that the electronic device 500 and the gyro sensor 510 are not limited to the configuration in FIG. 1, and various modifications such as omission of some of elements or addition of other elements are possible. In addition, examples of the electronic device 500 of the present embodiment include various types of devices such as digital cameras, video cameras, mobile phones, car navigation systems, robots, game machines, portable information terminals, and the like.

The electronic device 500 includes the gyro sensor 510 and a processing unit 520. In addition, the electronic device 500 may include a memory 530, an operation unit 540, and a display unit 550. The processing unit (CPU, MPU, and the like) 520 controls the gyro sensor 510 and the like and overall operation of the electronic device 500. The processing unit 520 performs processing based on angular velocity information (physical quantity) detected by the gyro sensor (physical quantity transducer) 510. For example, the processing unit 520 performs processing for camera shake compensation, posture control, GPS autonomous navigation, and the like, based on the angular velocity information. The memory (ROM, RAM, and the like) 530 stores control program and various data, and serves as a work area and a data storage area. The operation unit 540 is provided for the user to operate the electronic device 500, and the display unit 550 displays various information to the user.

1.2. Gyro Sensor

The gyro sensor 510 includes a vibrator 10 and the detection device 30. The vibrator 10 shown in FIG. 1 is a tuning fork type piezoelectric vibrator formed from a thin plate of a piezoelectric material such as quartz, and the like, and includes driving vibrators 11 and 12 and detecting vibrators 16 and 17. The driving vibrators 11 and 12 include driving terminals 2 and 4, and the detecting vibrators 16 and 17 includes detecting terminals 6 and 8.

A driving circuit 40 is included in the detection device 30 to output a driving signal (driving voltage) to drive the vibrator 10 (physical quantity transducer in a broad sense), and receive a feedback signal from the vibrator 10. Thus, the vibrator 10 is excited. A detection circuit 60 receives a detection signal (detection current, electric charge) from the vibrator 10 driven by the driving signal and detects (extracts) a desired signal (Coriolis force signal) from the detection signal.

Specifically, an alternating driving signal (driving voltage) from the driving circuit 40 is applied to the driving terminal 2 of the driving vibrator 11. Then, the driving vibrator 11 starts vibrating by the reverse voltage effect, and the driving vibrator 12 also starts vibrating by the tuning fork vibration. At this time, a current (electric charge) generated by the piezoelectric effect of the driving vibrator 12 is fed back from the driving terminal 4 to the driving circuit 40 as a feedback signal. Thereby, an oscillation loop including the vibrator 10 is formed.

When the driving vibrators 11 and 12 vibrate, the detecting vibrators 16 and 17 vibrate at the vibration velocity v in the direction shown in FIG. 1. Then, a current (electric charge) generated by the piezoelectric effect of the detecting vibrators 16 and 17 is output from the detection terminals 6 and 8 as a detection signal. Then, the detection circuit 60 receives the detection signal from the vibrator 10 and detects a desired signal (desired wave) corresponding to the Coriolis force. That is, when the vibrator 10 (gyro sensor) rotates about a detection axis 19, a Coriolis force Fc is generated in a direction orthogonal to the vibration direction of the vibration velocity v. For example, when the angular velocity of rotation about the detection axis 19 is ω, the mass of the vibrator is m, and the oscillation velocity of the vibrator is v, the Coriolis force is expressed as Fc=2m·v·ω. Therefore, by detecting (extracting) the desired signal (sensor signal) which is a signal corresponding to the Coriolis force, the detection circuit 60 may obtain the rotational angular velocity ω of the gyro sensor (vibrator). By using the obtained angular velocity ω, the processing unit 520 may perform various processing for camera shake compensation, posture control, GPS autonomous navigation, and the like.

The vibrator 10 has a driving side resonance frequency fd and a detection side resonance frequency fs. Specifically, the natural resonance frequency (the natural resonance frequency of the driving vibration mode) of the driving vibrators 11 and 12 is fd and the natural resonance frequency (the natural resonance frequency of the detection vibration mode) of the detecting vibrators 16 and 17 is fs. In this case, a certain frequency difference is provided between fd and fs so that undesired resonance coupling does not arise between the driving vibrators 11 and 12 and the detecting vibrators 16 and 17. The detuning frequency Δf=|fd−fs|, which is the frequency difference, is set to a sufficiently smaller frequency than fd and fs.

FIG. 1 shows an example where the vibrator 10 is a tuning fork type, but the vibrator 10 of the present embodiment is not limited to such a configuration only. For example, the vibrator 10 may be in a T shape, a double T shape, and the like. The piezoelectric material of the vibrator 10 may be other than quartz.

1.3. Detection Circuit

The detection circuit 60 as an embodiment of the circuit device according to the invention includes an input terminal to which output signals ISP and ISM from the vibrator are input. The detection circuit 60 includes an amplification circuit 100, a sensitivity adjustment circuit 110, a synchronization detection circuit 120, a filter unit (filter circuit) 130, and an A/D conversion circuit 140. It should be noted that some may be omitted except for the filter unit 130 and the A/D conversion circuit 140.

The amplification circuit 100 amplifies the output signals ISP and ISM from the vibrator 10. The amplification circuit 100 includes Q/V conversion circuits 101 and 102 and a differential amplification circuit 103. The Q/V conversion circuits 101 and 102 receive the signals ISP and ISM from the vibrator 10, and convert the electric charge (current) generated in the vibrator 10 into a voltage. The differential amplification circuit 103 performs differential amplification of the signals VS1P and VS1M from the Q/V conversion circuits 101 and 102, and outputs a signal VS2.

The sensitivity adjustment circuit 110 of FIG. 2 performs sensitivity adjustment processing, and outputs the signal VS3. Specifically, the sensitivity is adjusted by variably controlling the gain. The sensitivity adjustment circuit 110 may include, for example, a variable resistor whose resistance value is variably controlled based on sensitivity adjustment data, an operational amplifier for amplifying a signal with the gain (amplification factor) determined by the resistance value (resistance ratio) of the variable resistor, and the like.

The synchronization detection circuit (detection circuit, detector) 120 performs synchronization detection on the amplified signal VS3 based on a reference signal (reference clock), and outputs the signal VS4. By this synchronization detection, a mechanical vibration leakage signal, which is an undesired signal having a phase difference of 90 degrees with respect to the sensor signal, may be removed.

The filter unit 130 performs filtering processing for the signal VS4 after the synchronization detection, and also serves as a preliminary circuit of the A/D conversion circuit 140. The filter unit 130 is a passive filter, and specifically, a low pass filter that removes high frequency components, and performs low pass filter processing to output the signal VS5. The A/D conversion circuit 140 converts a digital signal to analog signal.

1.4. Undesired Signal (Leakage Signal)

As shown in FIGS. 3A to 3C, a desired signal (desired wave) and an undesired signal (undesired wave) are mixed together in the sensor signal. Since the amplitude of the undesired signal is generally about 100 to 500 times the amplitude of the desired signal, the detection device 30 is required to provide high performance. This undesired signal is caused by mechanical vibration leakage, electrostatic coupling leakage, detuning frequency Δf, 2fd (2ωd), DC offset, and the like.

The undesired signal of mechanical vibration leakage is generated when the vibration components of the driving vibrators 11 and 12 are mechanically leaked to the detecting vibrators 16 and 17 through a substrate 15. The undesired signal of the mechanical vibration leakage superimposed on the signal ISP and the undesired signal of the mechanical vibration leakage superimposed on the signal ISM are opposite phases to each other and may not be eliminated by the differential amplification circuit 103. However, since the undesired signal of mechanical vibration leakage superimposed on the signal VS2 has a phase difference of 90 degrees from the desired signal, it may be eliminated by the sensitivity adjustment circuit 110.

Next, removal of the undesired signals using the frequency spectra of FIGS. 3A to 3C will be described in detail. FIG. 3A is a frequency spectrum before synchronization detection. As shown in FIG. 3A, in the sensor signal before synchronization detection, an undesired signal of DC offset is present in the frequency bandwidth of DC. In addition, in the frequency bandwidth of fd, an undesired signal of mechanical vibration leakage and a desired signal are present.

FIG. 3B shows the frequency spectrum after synchronization detection. As shown in FIG. 3B, the desired signal in the frequency bandwidth of fd in FIG. 3A appears in the frequency bandwidth of DC after synchronization detection. The undesired signal (DC offset) of the frequency bandwidth of DC in FIG. 3A appears in the frequency bandwidth of fd after synchronization detection as shown in FIG. 3B. The undesired signal (mechanical vibration leakage signal) in the frequency bandwidth of fd in FIG. 3A appears in the frequency bandwidth of 2fd after synchronization detection as shown in FIG. 3B. In FIG. 3A, when an undesired signal is present in the frequency bandwidth of 2fd, the undesired signal appears in the frequency bandwidths 3fd and fd after synchronization detection. In addition, the mixed noise after the detection includes noise, and the like generated by a circuit at the rear end of the sensitivity adjustment circuit 110.

FIG. 3C shows the frequency spectrum after filtering. Frequency components of undesired signals in the frequency bandwidths such as fd, 2fd, and the like are removed by smoothing (LPF) the signal after synchronization detection by the filter unit 130.

1.5. 1/f Noise

As described above, while the filter unit 130 removes the frequency components of undesired signals in the frequency bandwidths such as fd, 2fd, and the like, there occurs not only thermal noise but also noise when the current flows through the resistance element of the filter unit 130. This noise has the 1/f characteristics, and is thus referred to as 1/f noise, current noise, excess noise, and the like. In particular, as described above, since the amplitude of the undesired signal is generally about 100 to 500 times the amplitude of the desired signal, when the current flows through the filter unit 130, the noise generated in the filter unit 130 is not negligible in the high-precision physical quantity measurement. This is because the noise generated in the filter unit 130 causes a temporal fluctuation over a long period of time in the digital signal.

1.6. Resistance Element in the Filter Unit

Figure 5:
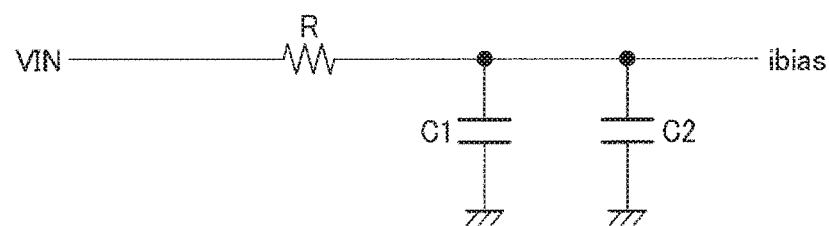
FIG. 5 is an equivalent circuit diagram of the filter unit shown in FIG. 2.

FIG. 4 shows a sectional structure of a resistance element R in the equivalent circuit of the filter unit 130 shown in FIG. 5. The filter unit 130 includes the resistance element R and capacitors C1 and C2. In FIG. 4, the resistance element R is connected to first and second wiring layers 681 and 682 through first and second contacts 671 and 672 and includes a metal thin film layer 650. The method of manufacturing the metal thin film layer 650 will be described in relation to a manufacturing process of a transistor formed on a Si substrate (semiconductor substrate) 600.

In FIG. 4, the transistor includes source and drain regions 602 and 602 into which impurities are implanted in a region which is partitioned by a thermal oxide film 601, and a gate 620 formed on a channel region with a gate oxide film 610 interposed therebetween. The gate 620 is a doped polysilicon layer implanted with an impurity. A silicide layer 640, which is a compound of silicon and a metal, is formed on the surfaces of the source and drain regions 602 and 602 and the gate 620 to reduce the resistance. In FIG. 4, a wiring layer 680 is shown, which is connected to the silicide layer 640 of one of the source and drain regions 602 through a contact 670.

The metal thin film layer 650, the contacts 671 and 672, and the wiring layers 681 and 682 shown in FIG. 4 are also manufactured by using the manufacturing process of the transistor described above. A polysilicon layer 630, which is a lower layer of the metal thin film layer 650 and is an upper layer of the thermal oxide film (insulating film) 601, is formed in the same manner as the gate 620. However, the gate 620 is a doped polysilicon layer doped with impurities, and the polysilicon layer below the metal thin film layer 650 is a non-doped polysilicon layer 630. Therefore, while the impurities are implanted into the gate 620, the non-doped polysilicon layer 630 is masked. Since the non-doped polysilicon layer 630 has a higher resistance than the metal thin film layer 650, the current flows exclusively through the metal thin film layer 650.

The metal thin film layer 650 shown in FIG. 4 is formed in the same process as the silicide layer 640. That is, the metal thin film layer 650 may be formed as a silicide layer. This silicide layer may include a compound of tungsten (w), titanium (Ti), cobalt (Co), nickel (Ni) or molybdenum (Mo) and silicon. The contacts 671 and 672 shown in FIG. 4 may be formed in the same process as the contact 670, and the wiring layers 681 and 682 may be formed in the same process as the wiring layer 680.

In order to ensure a predetermined resistance value of the resistance element R of the filter unit 130, the metal thin film layer 650 having a small sheet resistance value shown in FIG. 4 is formed by redundantly routing the structure of FIG. 4 in a plan view as seen from the thickness direction of the semiconductor substrate 600. At that time, since the metal thin film layer 650 formed of the silicide layer has the line and space widths narrower than those of the polysilicon layer that is the related resistance element, it is possible to ensure the resistance value by effectively utilizing the limited area.

1.7. Evaluation of Filter Unit

Figure 6:
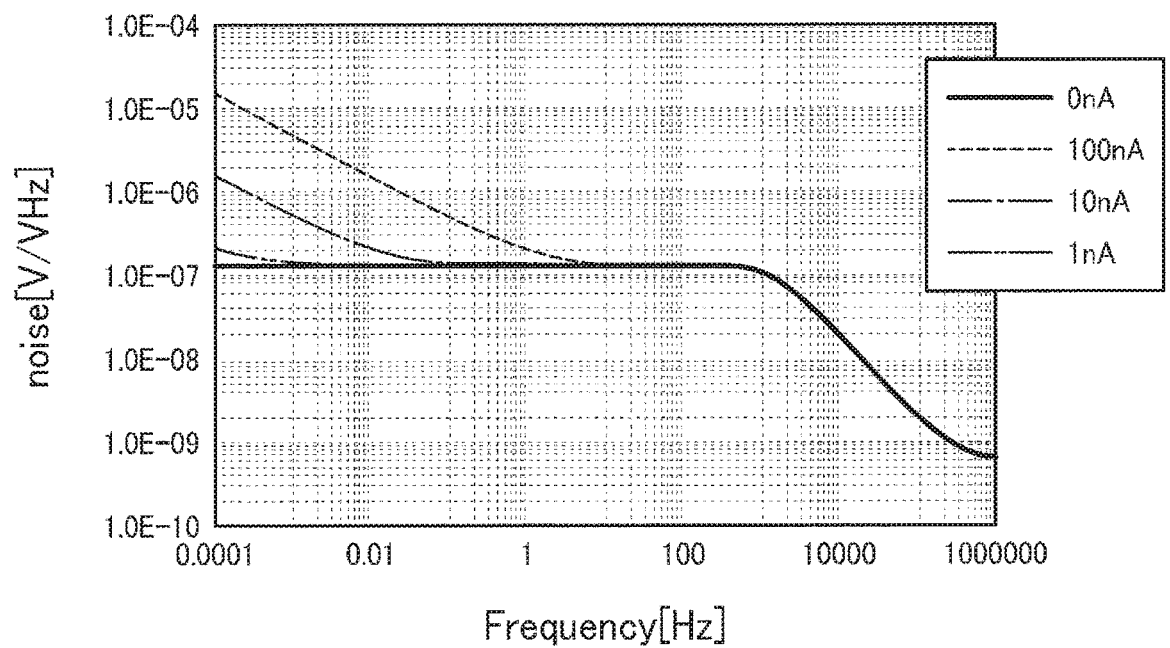
FIG. 6 is a characteristic diagram showing noise generated in a filter unit according to a comparative example.

A current was flowed through the equivalent circuit of the filter unit 130 shown in FIG. 5, and the noise generated in the filter unit 130 was evaluated. FIG. 6 shows the characteristics of the comparative example. Here, in the comparative example, doped polysilicon was used instead of the metal thin film layer 650. The doped polysilicon resistor used in this comparative example has a sheet resistance value per unit area of 1000Ω. As shown in FIG. 6, it is found that no noise is generated when no current flows (0 nA), but as the current flow increases to 1 nA, 10 nA, 100 nA, the noise level increases.

Figure 7:
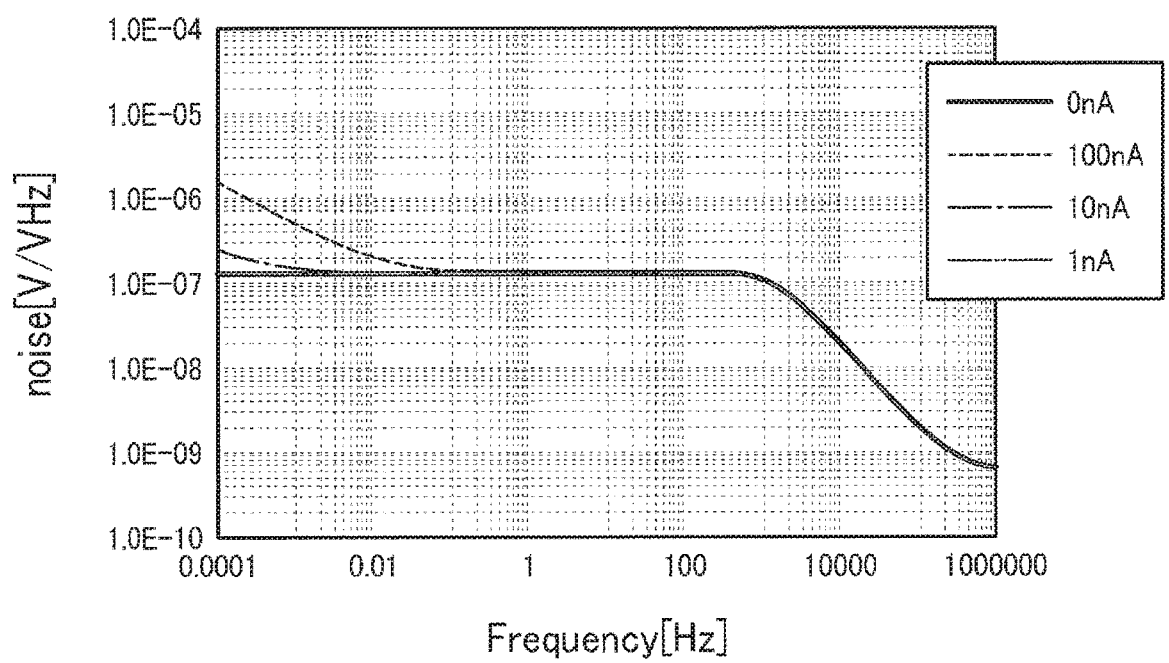
FIG. 7 is a characteristic diagram showing noise generated in a filter unit according to an embodiment.

On the other hand, FIG. 7 shows the characteristics of the filter unit 130 of the present embodiment using the metal thin film layer 650. The sheet resistance value per unit area of the metal thin film layer 650 is 182Ω, which is equal to or less than ⅕ of that of the comparative example. As is apparent from comparison with FIG. 6, it is found that the noise generated by the filter unit 130 of the present embodiment shown in FIG. 7 is reduced by about one order of magnitude. Thus, by reducing the noise generated in the filter unit 130, it is possible to suppress temporal fluctuations over a long period of time in the digital signal.

Figure 8:
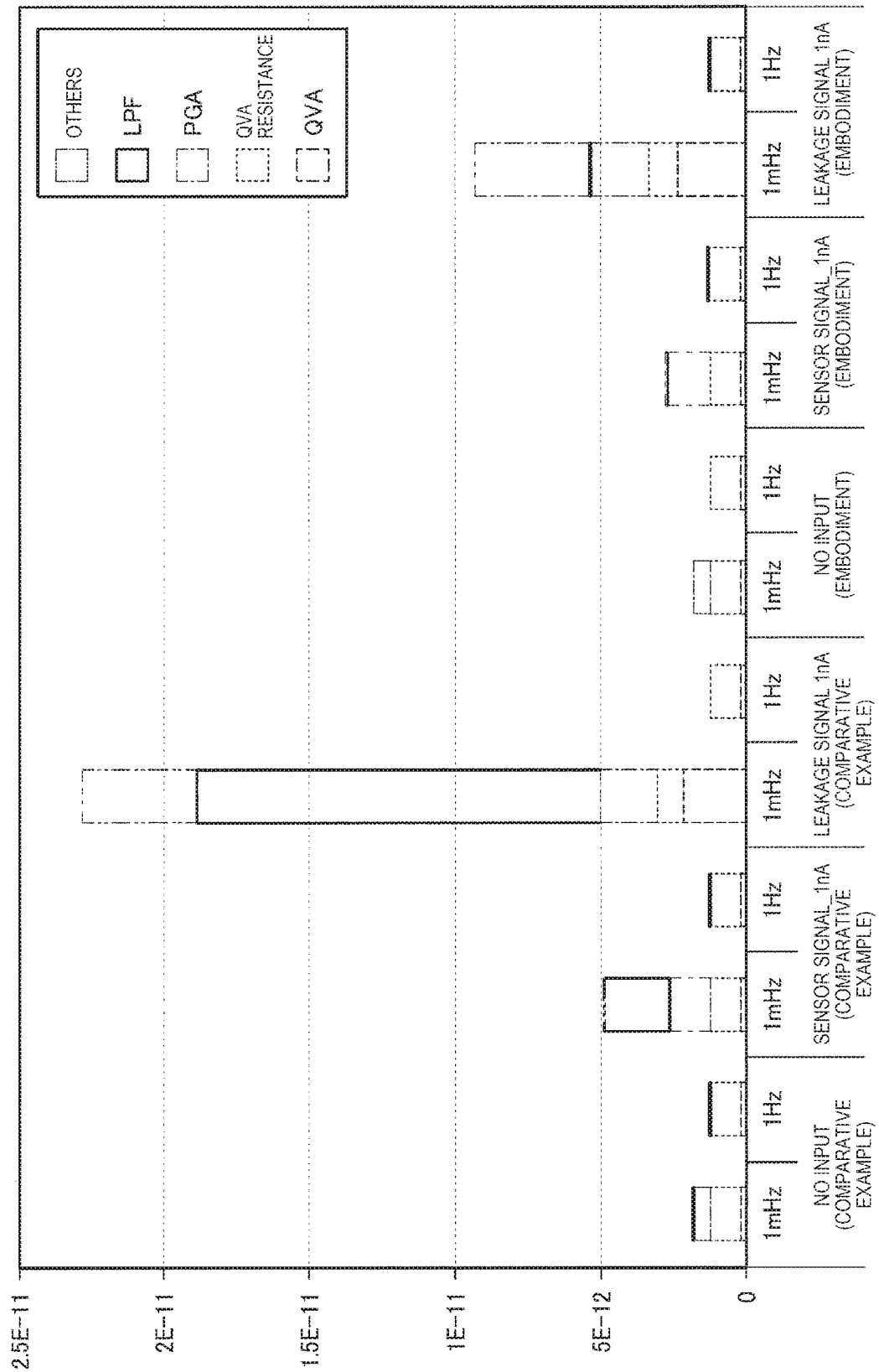
FIG. 8 is a characteristic diagram showing noise generated from each unit of the detection circuit shown in FIG. 2.

FIG. 8 shows the magnitude of noise generated in the QV amplifier (QVA) of the amplification circuit 100 shown in FIG. 2, the programmable gain amplifier (PGA) of the sensitivity adjustment circuit 110, and the low pass filter (LPF) which is the filter unit 130, in each of the comparative example and the present embodiment. As shown in FIG. 8, it is found that the noise generated when the undesired signal flows through the low pass filter (LPF) which is the filter unit 130 is sufficiently reduced in the present embodiment.

Figure 9:
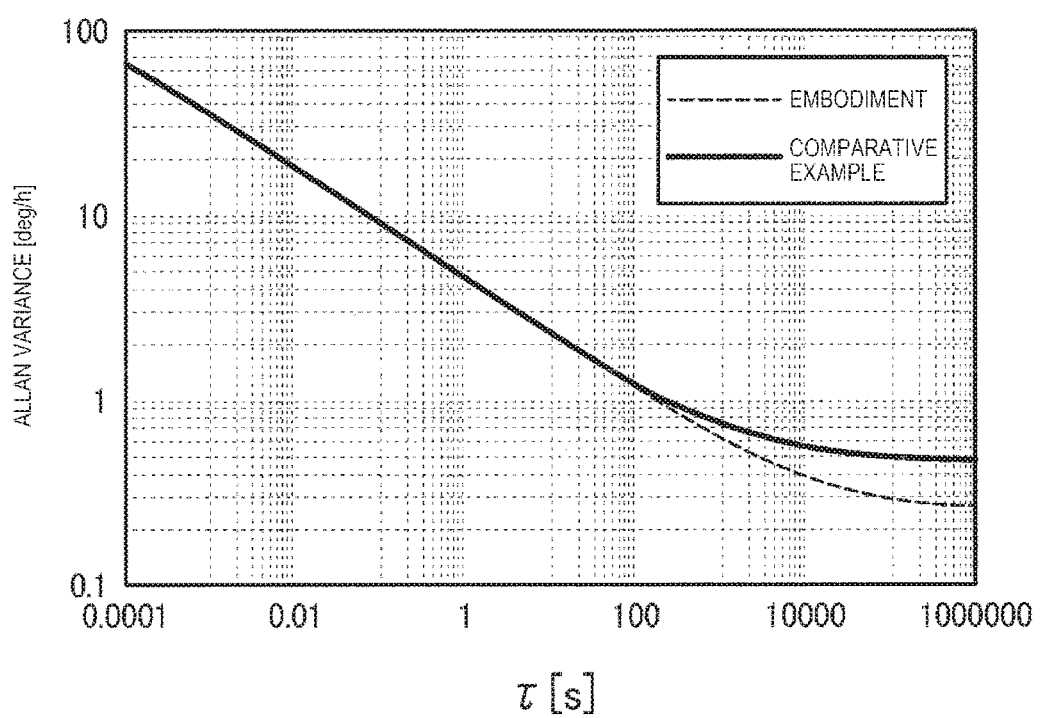
FIG. 9 is a characteristic diagram showing Allan variance calculated by converting a noise simulation result.

FIG. 9 is a characteristic diagram showing Allan variance calculated by converting the noise simulation result under a condition that the level of the mechanical vibration leakage signal is 57 ppm. Allan variance is one of indices used for the performance assessment of gyro sensors, frequency oscillators, and the like. FIG. 9 shows the relationship between a measurement time interval τ and a variance σ of the data averaged over the time interval, and enables to assess the noise characteristics of sensors and the like by plotting the measurement time intervals τ on the horizontal axis and the Allan variances σ on the vertical axis. It is found that the Allan variances of the present embodiment shown by the dotted lines in FIG. 9 modify the Allan variances of the comparative example indicated by the solid lines, and has the good noise characteristic. In this manner, the Allan variance evaluation may be enhanced, and errors due to noise may be reduced over a long period of time.

2. Second Embodiment

Figure 10:
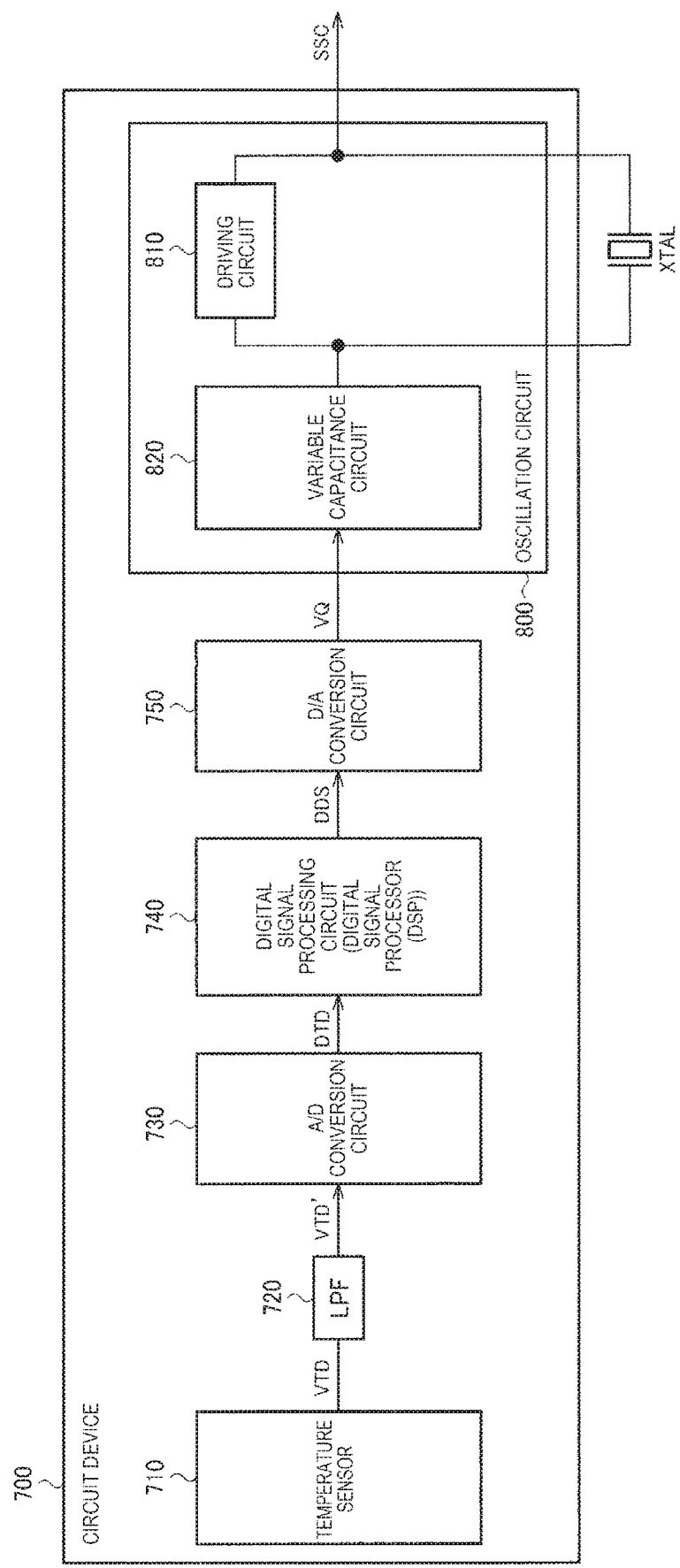
FIG. 10 is a block diagram of an oscillator according to a second embodiment of the invention.

FIG. 10 is a block diagram of an oscillator including a circuit device according to the invention. The circuit device 700 is a circuit device (integrated circuit device, semiconductor chip) that realizes a digital oscillator such as TCXO or Oven Controlled Crystal Oscillator (OCXO). For example, a digital oscillator is realized by housing the above circuit device and a vibrator XTAL in a package.

The circuit device 700 includes a temperature sensor 710, a filter unit such as a low pass filter (LPF) 720, an A/D conversion circuit 730, a digital signal processing circuit 740 (a digital signal processor (DSP)), a D/A conversion circuit 750, and an oscillation circuit 800 (VCO). It should be noted that the present embodiment is not limited to the configuration of FIG. 10, and may have various modifications such as omission of some of the components other than the LPF 720 and the A/D conversion circuit 730, or addition of other components. For example, the temperature sensor 710 may be provided outside the circuit device 700, and a temperature detection voltage by the temperature sensor 710 may be input to the circuit device 700.

The temperature sensor 710 outputs a temperature-dependent voltage that varies according to a temperature of the environment (for example, circuit device or vibrator) as the temperature detection voltage VTD (temperature detection signal). For example, the temperature sensor 710 generates a temperature-dependent voltage using a circuit element having a temperature dependency, and outputs the temperature-dependent voltage with reference to a temperature-independent voltage (for example, bandgap reference voltage). For example, the temperature sensor 710 outputs a forward voltage of a PN junction as a temperature-dependent voltage.

The LPF 720 filters the temperature detection voltage VTD from the temperature sensor 710 and serves as a preliminary circuit of the A/D conversion circuit 730.

The A/D conversion circuit 730 performs A/D conversion of a temperature detection voltage VTD' at the LPF 720, and outputs the result as temperature detection data DTD. The A/D conversion method may employ a successive approximation type, a flash type, a pipeline type, a dual-slope integration type, and the like, for example.

The digital signal processing circuit 740 performs various signal processing. For example, the digital signal processing circuit 740 (temperature compensation unit) performs temperature compensation processing for compensating for the temperature characteristic of the oscillation frequency of the vibrator XTAL based on the temperature detection data DTD, and outputs frequency control data DDS for controlling the oscillation frequency. Specifically, the digital signal processing circuit 740 performs temperature compensation processing for canceling or reducing the fluctuation of the oscillation frequency due to a temperature change (to keep the oscillation frequency constant even when there is the temperature change) based on the temperature detection data DTD (temperature dependent data) that varies according to the temperature, coefficient data for temperature compensation processing (coefficient data of the approximation function) and the like. That is, by substituting the temperature detection data DTD into an approximate function that cancels or reduces the fluctuation of the oscillation frequency due to the temperature change, the frequency control data DDS is obtained. The digital signal processing circuit 740 is a Digital Signal Processor (DSP) that performs various signal processing including temperature compensation processing in a time division manner. Alternatively, the digital signal processing circuit 740 may be realized by an ASIC circuit such as a gate array, or may be realized by a processor (for example, CPU, MPU, and the like) and a program operating on the processor.

The D/A conversion circuit 750 performs D/A conversion of the frequency control data DDS and outputs differential signals VQ (two voltage signals) corresponding to the frequency control data DDS.

The oscillation circuit 800 oscillates the vibrator XTAL at the oscillation frequency corresponding to the differential signal from the D/A conversion circuit 750, and outputs the oscillation signal SSC of the oscillation. That is, the oscillation circuit 800 is a voltage controlled oscillator (VCO) that uses two voltage signals constituting the differential signal as control voltages. The oscillation circuit 800 includes a driving circuit 810 for driving the vibrator XTAL and a variable capacitance circuit 820 connected to an oscillation loop of the vibrator XTAL. In the variable capacitance circuit 820, the capacitance value is variably controlled by two voltage signals constituting the differential signal from the D/A conversion circuit 750. By controlling the capacitance value of the variable capacitance circuit 820, the oscillation frequency (frequency of the oscillation signal SSC) of the oscillation circuit 800 is controlled.

Here, the metal thin film layer 650 shown in FIG. 4 may be used as the resistor of the LPF 720. As a result, the noise generated in the LPF 720 is reduced as described above, and the oscillation frequency in the oscillation circuit 800 may be temperature-compensated with higher accuracy.

3. Third Embodiment

Figure 11:
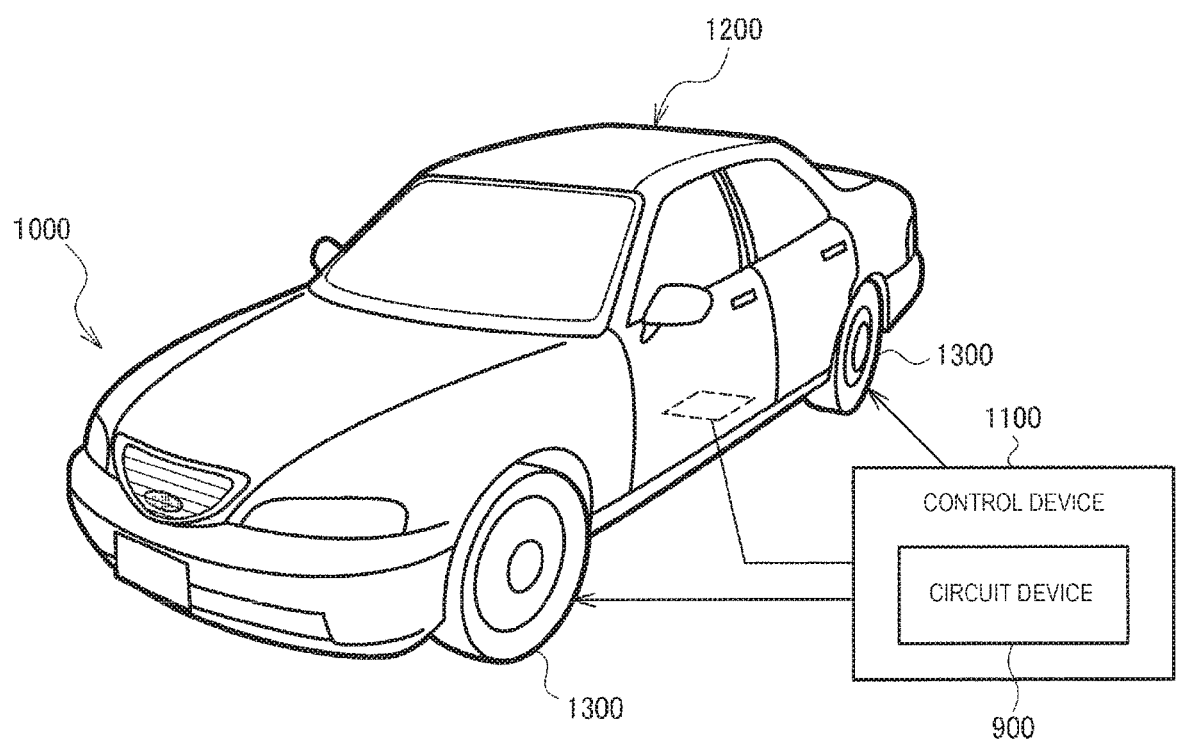
FIG. 11 is a diagram showing a vehicle according to a third embodiment of the invention.

FIG. 11 shows an example of a vehicle including a circuit device 900 of the present embodiment. The circuit device 900 according to the present embodiment may be incorporated in various vehicles such as automobiles, airplanes, motorcycles, bicycles, robots, ships, and the like, for example. For example, the vehicle is a device or apparatus that moves over the ground, the sky, or the sea, and includes a driving mechanism such as an engine and a motor, a steering mechanism such as a steering wheel and a rudder, and various electronic devices (in-vehicle equipment). FIG. 11 schematically shows an automobile 1000 as a specific example of the vehicle. An oscillator (not shown) including the circuit device 900 of the present embodiment is incorporated in the automobile 1000. A control device 1100 performs various control processing based on the oscillation signal (clock signal) generated by the oscillator. The control device 1100 controls the hardness and softness of the suspension according to the posture of a vehicle body 1200, and controls the brakes of individual wheels 1300, for example. The apparatus incorporating the detection circuit 60 and the circuit device 900 (oscillator) according to the present embodiment may be incorporated into a vehicle such as the automobile 1000, a robot, or an electronic device.

It should be noted that while the present embodiment has been described in detail as above, it will be easily understood by those skilled in the art that many modifications are possible that do not deviate practically from the novel matters and effects of the invention. Therefore, all such modifications are included in the scope of the invention. For example, terms described, at least once, together with different terms having a broader sense or the same sense in the specification or drawings may be replaced by such different terms anywhere in the specification or drawings. In addition, all combinations of the present embodiment and modifications are also included in the scope of the invention. Further, the configuration, operation, and the like of the circuit device, the physical quantity measuring device, the oscillator, the electronic device, or the vehicle are not limited to those described in this embodiment, and various modifications are possible.

What is claimed is:

1. A circuit device comprising:
   an input terminal to which a detection target signal from a physical quantity transducer is input;
   a filter circuit to which a detection signal based on the detection target signal is input, and which has a resistance element including a metal thin film layer; and
   an A/D conversion circuit performs A/D conversion of the detection signal filtered by the filter circuit, and outputs detection data,
   wherein the metal thin film layer is a silicide layer which is a compound of metal and silicon.

2. The circuit device according to claim 1,
   wherein the metal thin film layer is formed on a non-doped polysilicon provided on a semiconductor substrate with an insulating film interposed therebetween.

3. The circuit device according to claim 2, further comprising:
   a first contact for connecting a first wiring and one end of the metal thin film layer; and
   a second contact for connecting other end of the metal thin film layer and a second wiring.

4. The circuit device according to claim 1,
   wherein the filter circuit is a low pass filter circuit including the resistance element and a capacitor.

5. The circuit device according to claim 1,
   wherein the filter circuit is a passive filter circuit including the resistance element and a capacitor.

6. The circuit device according to claim 1, further comprising:
   a synchronization detection circuit outputs the detection signal after synchronization detection to the filter circuit.

7. The circuit device according to claim 6, further comprising:
   an amplification circuit outputs an amplified detection signal to the synchronization detection circuit.

8. The circuit device according to claim 1,
   wherein the detection signal includes the detection target signal from the physical quantity transducer and a mechanical vibration leakage signal.

9. The circuit device according to claim 8, further comprising:
   a driving circuit that drives the physical quantity transducer.

10. A physical quantity measuring device comprising:
    a physical quantity transducer; and the circuit device according to claim 1, to which a detection signal from the physical quantity transducer is input.

11. A physical quantity measuring device comprising:

a physical quantity transducer; and the circuit device according to claim 2, to which a detection signal from the physical quantity transducer is input.

12. A physical quantity measuring device comprising:

a physical quantity transducer; and the circuit device according to claim 3, to which a detection signal from the physical quantity transducer is input.

13. An oscillator comprising:

a vibrator;

a filter circuit to which a temperature detection signal from a temperature sensor is input and which has a resistance element including a metal thin film layer; and an A/D conversion circuit performs A/D conversion of the temperature detection signal filtered by the filter circuit, and outputs detection data, and wherein the oscillator compensates a temperature characteristic of an oscillation frequency of the vibrator based on the temperature detection signal, wherein the metal thin film layer is a silicide layer which is a compound of metal and silicon.

14. An electronic device comprising:

the circuit device according to claim 1; and a processing circuit that performs processing based on the detection data from the circuit device.

15. An electronic device comprising:

the circuit device according to claim 2; and a processing circuit that performs processing based on the detection data from the circuit device.

16. An electronic device comprising:

the circuit device according to claim 3; and a processing circuit that performs processing based on the detection data from the circuit device.

17. A vehicle comprising:

a body; and a control device which is mounted on the body and includes the circuit device according to claim 1.

18. A vehicle comprising:

a body; and a control device which is mounted on the body and includes the circuit device according to claim 2.

19. A vehicle comprising:

a body; and a control device which is mounted on the body and includes the circuit device according to claim 3.

\* \* \* \* \*